United States Patent [19]
Solberg

[11] 3,946,253
[45] Mar. 23, 1976

[54] PULSE TRAIN GENERATOR

[75] Inventor: Bjorn Ragnar Solberg, Oslo, Norway

[73] Assignee: International Standard Electric Corporation, New York, N.Y.

[22] Filed: Aug. 2, 1974

[21] Appl. No.: 494,243

[30] Foreign Application Priority Data
Oct. 26, 1973  Italy .................................. 30589/73

[52] U.S. Cl. ............... 307/261; 307/235 J; 307/296
[51] Int. Cl.² ........................................ H03K 17/00
[58] Field of Search......... 307/235, 296, 261, 235 J, 307/235 K, 255; 328/171; 330/139 S, 141, 107

[56] References Cited
UNITED STATES PATENTS

| | | | |
|---|---|---|---|
| 3,206,689 | 9/1965 | Santana........................... | 307/235 R |
| 3,292,096 | 12/1966 | Deneen, Jr........................ | 330/141 |
| 3,484,704 | 12/1969 | Hungerford...................... | 307/235 R |
| 3,488,604 | 1/1970 | Smilowitz........................ | 330/139 |

*Primary Examiner*—Stanley D. Miller, Jr.
*Assistant Examiner*—B. P. Davis
*Attorney, Agent, or Firm*—John T. O'Halloran; Menotti J. Lombardi, Jr.; Alfred C. Hill

[57] ABSTRACT

A circuit is disclosed for generating a periodic pulse train having any fixed desired duty cycle from a periodic input signal which may be either analog or digital. The input signal is fed to a transistor amplifier whose bias can be varied. The output of the transistor amplifier is coupled to an amplifying element whose possible voltage swing is limited to provide the desired pulse train. The desired pulse train from the amplifying element is coupled through a low-pass filter prior to comparison with a reference voltage in a differential amplifier. The voltage difference at the output of the differential amplifier adjusts the bias of the transistor amplifier such that the voltage of the low pass filtered desired pulse train is very close to the reference voltage.

16 Claims, 7 Drawing Figures

PULSE TRAIN GENERATOR

BACKGROUND OF THE INVENTION

This relates to pulse generators and more particularly to a circuit to generate periodic pulse trains with a fixed duty cycle.

In electronic systems there is often a need for generating pulse wave forms from sinusoidal or other periodic input signals. This operation is called squaring or clipping. In some applications there is the requirement of having a duty cycle that is a constant and not varying with circuit parameters of active elements, temperature or voltage of input signals. Duty cycle as employed herein is defined as the ratio between the time the output waveform is high and the period of the output waveform.

The importance of this latter requirement is obvious in many digital systems, e.g. in synchronous systems where both edges of the clock are used, and in systems where the pulse train is used to gate out signals of a certain width, as happens in return-to-zero coding in pulse transmission.

Various principles exist for generating square-wave signals from analog signals. Some examples are given in FIGS. 1a, 1b and 1c.

FIG. 1a shows a basic transistor clipper consisting of resistors 1, 2 and 3, transistor 4 and capacitor 5. This circuit is based on saturating and turning off the transistor, and the duty cycle of the output pulses depend strongly upon the amplitude and the waveform of the input signal, the transistor parameters and thus upon temperature.

FIG. 1b shows squaring performed by comparison of the input signal to a reference voltage. This is done by the differentially coupled transistors 11 and 12 and resistors 6, 7, 8, 9 and 10. When the desired duty cycle is 50 percent, and the input signal is symmetrical, this circuit is ideally able to give rather good results. Due to a relatively low gain and interfacing problems, it is often necessary to employ additional amplification stages, which may lead to a deterioration of the duty cycle. Further, if exact duty cycles other than 50 percent is required, the circuit often proves disadvantageous, since the circuit produces output pulse trains whose duty cycle is dependent upon the input signal and the gain of the circuit.

In FIG. 1c a completely different concept is shown. The input signal is passed through a frequency doubler 11, whose output is squared in a low performance squarer 12, whose output is used to trigger a flip-flop 13 in a divide-by-two operation. The output of the flip-flop is pulses with very close to 50 percent duty cycle, the only deterioration is due to a difference in propagation delay between positive and negative transitions of the flip-flop. Furthermore the circuitry very often will be rather complex, and duty cycle other than 50 percent requires even higher complexity.

SUMMARY OF THE INVENTION

An object of the present invention is to provide a new system for generating a pulse train with a given and very accurate duty cycle from a periodic, but not necessarily sinusoidal reference signal.

Another object of the present invention is to provide a new system for generating a pulse train with a given and very accurate duty cycle within a large range of input signal voltages, rendering the duty cycle nearly independent of the actual voltage or the actual waveform of the input signal.

A feature of the present invention is the provision of a system for generating a periodic pulse train with any fixed desired duty cycle from a periodic input signal comprising: a first source of the input signal; a transistor amplifier coupled to the first source, the transistor amplifier having a bias which can be varied; and amplifying element direct current coupled to an output of the transistor amplifier, the amplifying element having a voltage swing limited in a predetermined manner to provide the periodic pulse train; a first low pass filter coupled to the amplifying element to low pass filter the periodic pulse train; a second source of a reference voltage; and a comparison amplifier coupled to the first low pass filter, the second source and the transistor amplifier to compare the output voltage of the first low pass filter with the reference voltage to produce a difference voltage for coupling to the transistor amplifier to vary the bias of the transistor amplifier to render the value of the output voltage of the first low pass filter very close to the value of the reference voltage.

The present invention may be employed in the following cases: generation of a periodic pulse signals having a specified duty cycle from a periodic analog signal; generation of a periodic pulse signals having a specified duty cycle from a periodic digital signal; and a clock extraction circuit used in line repeaters for digital transmission.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1A:
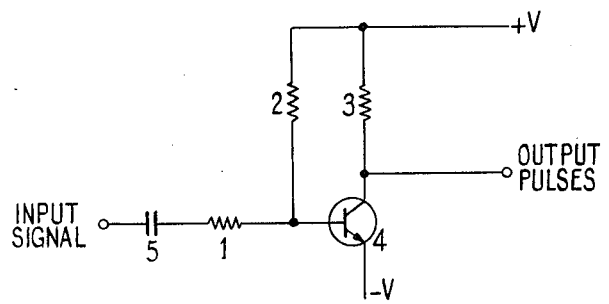
FIGS. 1a, 1b and 1c are schematic and block diagrams of prior art arrangements for generating square-wave signals from analog signals described hereinabove under the heading "Background of the Invention"
Figure 1B:
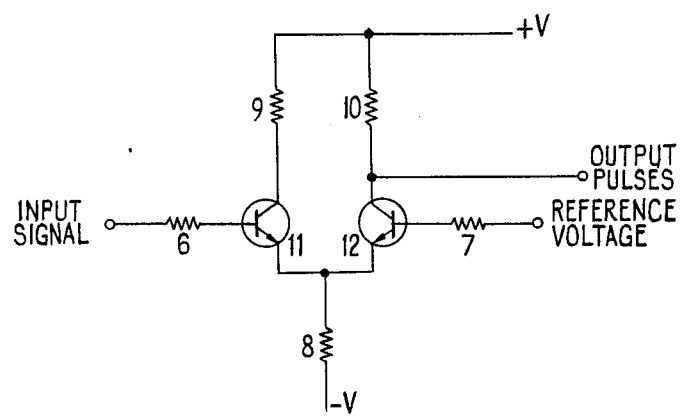
Figure 1C:
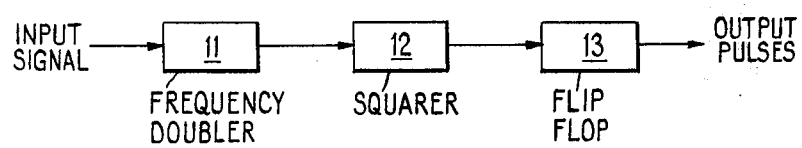
Figure 2:
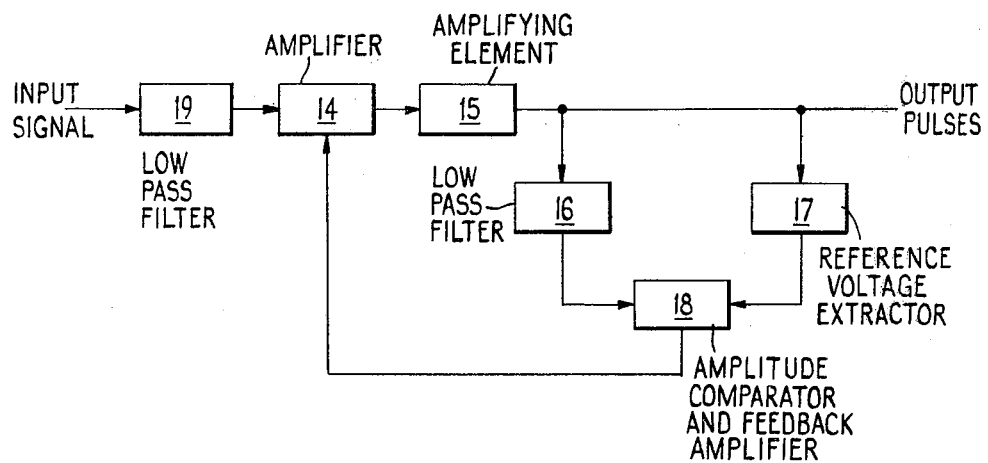
FIG. 2 is a block diagram of a pulse train generator in accordance with the principles of the present invention.

Referring to FIG. 2 the system of the present invention includes one high frequency part and one DC (Direct current) part, the latter through a feedback arrangement always trying to force the circuit to have as constant a duty cycle as possible.

The input signals pass through a low pass filter 19, which needs to be included only when the input signals are pulses. The transistor amplifier stage 14 selects the proper bias (e.g. proper base-current) according to the output of the feedback amplifier 18. The output of amplifier 14 is fed to an amplifying element 15, which generally can be any amplifier with large gain and two suitable clipping levels of voltages, but which advantageously will be a digital integrated circuit, like an inverter, NAND-gate, AND-gate, OR-gate, from any of the digital integrated circuit families (e.g. TTL, CMOS). The output of element 15 is the output pulse train. This is also fed into a low pass filter 16 which provides as its output the DC average voltage of the pulse train. This voltage is compared to a reference voltage provided by the reference voltage extractor 17 in amplitude comparator and feedback amplifier 18 in the form of a differential amplifier. The output of amplifier 18 regulates the bias point of the input transistor of amplifier 14 so that the output pulses will have a duty cycle which is controlled by the reference voltage extractor only. This will be true for a large range of input voltages and input waveforms. Low pass filter 19, whose exact cut-off frequency is not very important, also helps maintaining a fixed output pulse train duty cycle for large variation of the input pulse train duty cycle.

Figure 3:
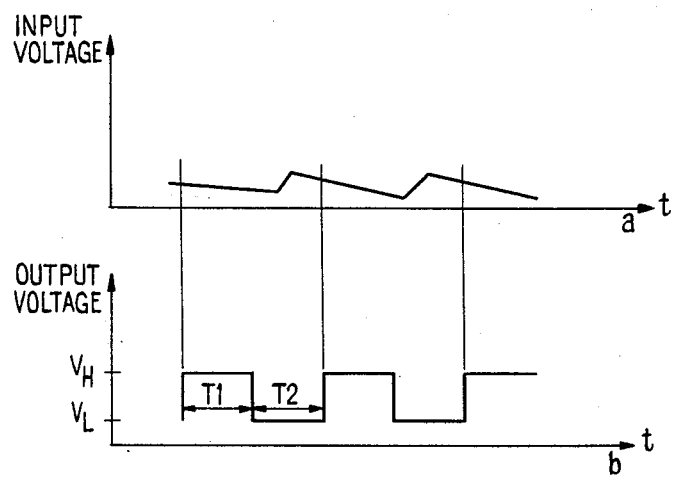
FIG. 3 illustrates one example of the input and output waveforms of FIG. 2.

FIG. 3a shows an example of input waveform and FIG. 3b shows the output pulses obtained. The duty cycle $k$ may be defined as $k = T_1/T_1 + T_2$, where $T_1$ is the time of a period that the pulses are higher than a defined threshold and $T_2$ is the time of a period that the pulses are below this threshold.

If a duty cycle $k_o$ is desired the voltage out of the reference extractor 17, must be $V_{ref} = V_H k_o + V_L (1 - k_o)$.

The reference voltage extractor 17 may be constructed in several different ways, according to the values of $V_H$, the voltage level in the high (logical "1") state and $V_L$, the voltage level in the low (logical "0") state.

In some logic families $V_H$ and $V_L$ is very well defined or bear a fixed relationship with the supply voltages. In this case the reference extractor easily generates the reference voltage from the supply voltages.

Figure 4:
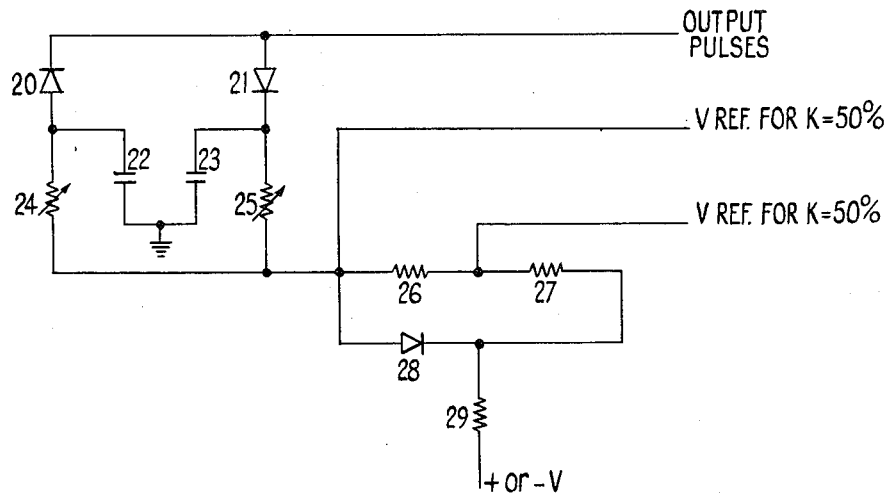
FIG. 4 is a schematic diagram of one embodiment of the reference voltage extractor of FIG. 2.

In the more general case $V_H$ and $V_L$ is not very well defined and for high accuracy, reference extractor 17 must use the actual values of $V_H$ and $V_L$. This can be done in a circuit as shown in FIG. 4. This circuit generates the DC voltages $V_H - V_D$ and $V_L + V_D$ by means of diodes 20 and 21 and capacitors 22 and 23. The difference between these voltages is divided down by the resistors 24 and 25. This divided voltage can be used directly as reference voltage output when the circuit is designed for 50 percent duty cycle, or if highest accuracy is not needed.

For duty cycles other than 50 percent, a diode voltage drop compensation circuit including resistors 26, 27 and 29 and diode 28 (diode 28 may also be the base-emitter diode of a transistor) will generate a more accurate reference voltage.

Figure 5:
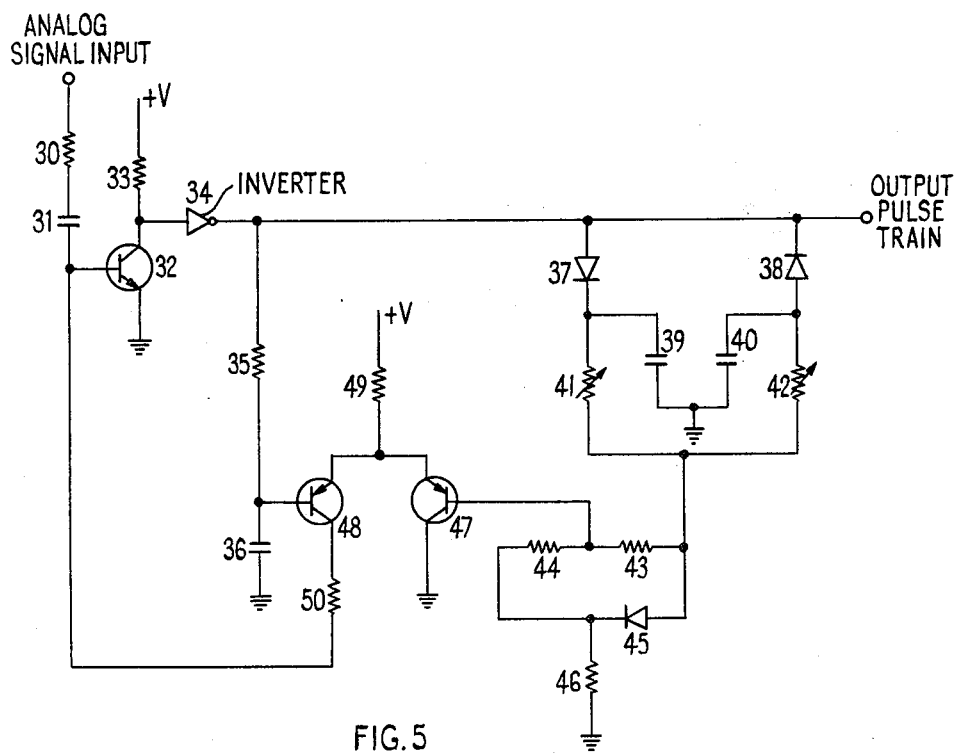
FIG. 5 is a schematic diagram of one embodiment of FIG. 2.

FIG. 5 shows a schematic diagram of a particular embodiment of the FIG. 2. An analog input signal of a waveform not necessarily symmetrical is fed via a resistor 30 and a capacitor 31 to the transistor 32 in its common emitter mode. Resistor 33 is a collector resistance and inverter (or gate) 34 is amplifying element 15 of FIG. 2 and is selected from a logic family e.g. TTL. Resistor 35 and capacitor 36 provide low pass filtering of the output pulse train and diodes 37, 38 and 45, capacitors 39 and 40, resistors 41, 42, 43 and 44 constitute the reference voltage extractor as explained previously.

The differential amplifier is the matched transistors 47 and 48 and resistors 49 and 50. This amplifier always gives the transistor 32 the right base current for the collector to adjust to a bias giving the right duty cycle at the output of inverter 34. The circuit parameters of transistor 32 and inverter 34 are not very important for the duty cycle, since any variation is compensated by regulation base current. Also the actual waveform or amplitude of the input signal will affect the duty cycle only very slightly.

While I have described above the principles of my invention in connection with specific apparatus it is to be clearly understood that this description is made only by way of example and not as a limitation to the scope of my invention as set forth in the objects thereof and in the accompanying claims.

I claim:

1. A system for generating a periodic pulse train with any fixed desired duty cycle from a periodic input signal comprising:
    a first source of said input signal;
    a transistor amplifier coupled to said first source, said transistor amplifier having a bias which can be varied;
    an amplifying element direct current coupled to an output of said transistor amplifier, said amplifying element having a voltage swing limited in a predetermined manner to provide said periodic pulse train;
    a first low pass filter coupled to said amplifying element to low pass filter said periodic pulse train;
    a second source of a reference voltage; and
    a comparison amplifier coupled to said first low pass filter, said second source and said transistor amplifier to compare the output voltage of said first low pass filter with said reference voltage to produce a difference voltage for coupling to said transistor amplifier to vary said bias of said transistor amplifier to render the value of the output voltage of said first low pass filter very close to the value of said reference voltage.

2. A system according to claim 1; wherein said input signal is an analog signal.

3. A system according to claim 1, wherein said input signal is a digital signal; and further including
    a second low pass filter coupled between said first source and said transistor amplifier.

4. A system according to claim 1, wherein said transistor amplifier is a common emitter type transistor amplifier, and said bias of said transistor amplifier is varied by variations of direct current base current supplied to said common emitter type transistor amplifier.

5. A system according to claim 1, wherein said amplifying element is an inverter.

6. A system according to claim 1, wherein said second source includes
    a reference voltage extractor coupled to the output of said amplifying element to provide said reference voltage varying according to variations of the voltage levels of said periodic pulse train.

7. A system according to claim 6, wherein said reference voltage extractor includes
    a pair of diodes oppositely poled coupled to the output of said amplifying element,
    ground potential,
    a pair of capacitors each coupled between a different one of said pair of diodes and ground potential to provide a voltage across said pair of capacitors from which said reference voltage is produced; and
    a pair of resistors each having one terminal coupled to a different one of said pair of capacitors and the other terminal connected to the other terminal of the other resistor of said pair of resistors to provide said reference voltage.

8. A system according to claim 7, wherein said duty cycle is adjusted by adjusting at least one of said pair of resistors.

9. A system according to claim 7, further including a reference voltage compensation network including
two series connected resistors, one of said two resistors being coupled to the other terminal of each of said pair of resistors,
a diode connected in parallel with said two resistors,
a power supply voltage source, and
a resistor connected between said diode and said power supply voltage source to forward bias said diode,
said reference voltage being coupled from the junction of said two resistors.

10. A system according to claim 1, wherein said comparison amplifier includes
ground potential;
one pair of transistors each having their emitters connected together, the base of one of said pair of transistors being coupled to said first low pass filter, the base of the other of said pair of transistors being coupled to said second source, the collector of said other of said pair of transistors being coupled to said ground potential and the collector of said one of said pair of transistors being coupled to the base of said transistor amplifier to determine the base current of said transistor amplifier.

11. A system according to claim 1, wherein said transistor amplifier is a common emitter type transistor amplifier, and
said bias of said transistor amplifier is varied by variations of direct current base current supplied to said common emitter type transistor amplifier; and
said second source includes
a pair of diodes oppositely poled coupled to the output of said amplifying element,
ground potential,
a pair of capacitors each coupled between a different one of said pair of diodes and ground potential to provide a voltage across said pair of capacitors from which said reference voltage is produced; and
a pair of resistors each coupled having one terminal coupled to a different one of said pair of capacitors and the other terminal connected to the other terminal of the other resistor of said pair of resistors to provide said reference voltage.

12. A system according to claim 11, further including a reference voltage compensation network including
two series connected resistors, one of said two resistors being coupled to the other terminal of each of said pair of resistors,
a diode connected in parallel with said two resistors,
a power supply voltage source, and
a resistor connected between said diode and said power supply voltage source to forward bias said diode,
said reference voltage being coupled from the junction of said two resistors.

13. A system according to claim 12, wherein said comparison amplifier includes
one pair of transistors each having their emitters connected together, the base of one of said pair of transistors being coupled to said first low pass filter, the base of the other of said pair of transistors being coupled to said second source, the collector of said other of said pair of transistors being coupled to said ground potential and the collector of said one of said pair of transistors being coupled to the base of said common emitter type transistor amplifier to vary said direct current base current.

14. A system according to claim 1, wherein said transistor amplifier is a common emitter type transistor amplifier, and
said bias of said transistor amplifier is varied by variations of direct current base current supplied to said common emitter type transistor amplifier; and further including
a reference voltage compensation network including
two series connected resistors, one of said two resistors being coupled to said second source,
a diode connected in parallel with said two resistors,
a power supply voltage source, and
a resistor connected between said diode and said power supply voltage source to forward bias said diode,
said reference voltage being coupled from the junction of said two resistors.

15. A system according to claim 14, wherein said comparison amplifier includes
ground potential;
one pair of transistors each having their emitters connected together, the base of one of said pair of transistors being coupled to said first low pass filter, the base of the other of said pair of transistors being coupled to said second source, the collector of said other of said pair of transistors being coupled to said ground potential and the collector of said one of said pair of transistors being coupled to the base of said common emitter type transistor amplifier to vary said direct current base current.

16. A system according to claim 1, wherein said transistor amplifier is a common emitter type transistor amplifier, and
said bias of said transistor amplifier is varied by variations of direct current base current supplied to said common emitter type transistor amplifier; and
said comparison amplifier includes
ground potential;
one pair of transistors each having their emitters connected together, the base of one of said pair of transistors being coupled to said first low pass filter, the base of the other of said pair of transistors being coupled to said second source, the collector of said other of said pair of transistors being coupled to said ground potential and the collector of said one of said pair of transistors being coupled to the base of said transistor amplifier to determine the base current of said transistor amplifier.

* * * * *